United States Patent
Hamaguchi (10) Patent No.: US 8,441,274 B2
(45) Date of Patent: May 14, 2013

(54) WAFER UNIT MANUFACTURING METHOD FOR TESTING A SEMICONDUCTOR CHIP WAFER

(75) Inventor: Shinichi Hamaguchi, Kanagawa (JP)

(73) Assignee: Advantest Corporation, Tokyo (JP)

( * ) Notice: Subject to any disclaimer, the term of this patent is extended or adjusted under 35 U.S.C. 154(b) by 170 days.

(21) Appl. No.: 12/945,742

(22) Filed: Nov. 12, 2010

(65) Prior Publication Data

US 2011/0084721 A1   Apr. 14, 2011

Related U.S. Application Data

(63) Continuation of application No. PCT/JP2008/059085, filed on May 16, 2008.

(51) Int. Cl.
*G01R 31/00* (2006.01)

(52) U.S. Cl.
USPC ............ 324/756.02; 324/754.07; 324/762.05

(58) Field of Classification Search .................. None
See application file for complete search history.

(56) References Cited

U.S. PATENT DOCUMENTS

| | | | |
|---|---|---|---|
| 7,733,102 B2 * | 6/2010 | Cheng ...................... 324/762.01 |
| 2001/0047496 A1 | 11/2001 | Hidaka et al. |
| 2004/0046580 A1 * | 3/2004 | Takemoto et al. ............ 324/754 |
| 2004/0175850 A1 | 9/2004 | Shimizu et al. |
| 2006/0154497 A1 | 7/2006 | Amemiya et al. |

FOREIGN PATENT DOCUMENTS

| | | |
|---|---|---|
| JP | S63-293934 A | 11/1988 |
| JP | H02-086147 A | 3/1990 |
| JP | 4188863 A | 7/1992 |
| JP | 5267563 A | 10/1993 |
| JP | H07-231021 A | 8/1995 |
| JP | H08-316274 A | 11/1996 |
| JP | 8335610 | 12/1996 |
| JP | 2001-210685 A | 8/2001 |
| JP | 2001-338953 A | 12/2001 |
| JP | 2002-222839 A | 8/2002 |
| JP | 2003-084047 A | 3/2003 |
| JP | 2003-133538 A | 5/2003 |
| JP | 2006-194620 A | 7/2006 |
| JP | 2007-134048 A | 5/2007 |
| JP | 2007171140 A | 7/2007 |
| JP | 2007250124 | 9/2007 |
| JP | 2008-089461 A | 4/2008 |

OTHER PUBLICATIONS

Japanese Office Action dated Jul. 10, 2012, in a counterpart Japanese patent application No. 2010-511830.

(Continued)

*Primary Examiner* — Minh N Tang (57) ABSTRACT

A manufacturing method of manufacturing a wafer unit for testing includes forming a plurality of test circuits on a circuit wafer, forming a plurality of circuit pads on a predetermined surface of a connecting wafer, forming a plurality of wafer pads on a rear surface of the connection wafer opposing the predetermined surface, forming a plurality of long via holes to electrically connect the plurality of circuit pads and the plurality of wafer pads, and forming the wafer unit for testing, by overlapping the circuit wafer and the connection wafer to electrically connect the plurality of test circuits and the plurality of circuit pads.

2 Claims, 7 Drawing Sheets

OTHER PUBLICATIONS

International Search Report (ISR) issued in PCT/JP2008/059085 (parent application) mailed in Jul. 2008 for Examiner consideration.
Written Opinion (PCT/ISA/237) issued in PCT/JP2008/059085 (parent application) mailed in Jul. 2008.
JP Office Action/ Search Report and Partial Translation Dated Sep. 27, 2012; Japanese Application No. 2010-511830.
JP Office Action and Machine Translation Dated Dec. 18, 2012; Application No. 2010-511830.
TW Office Action/Search Report and English Translation Dated Feb. 23, 2013; Application No. 098141756.

\* cited by examiner

FIG. 7

WAFER UNIT MANUFACTURING METHOD FOR TESTING A SEMICONDUCTOR CHIP WAFER

BACKGROUND

1. Technical Field

The present invention relates to a wafer unit for testing and a manufacturing method thereof. In particular, the present invention relates to a wafer unit for testing provided with a plurality of test circuits for testing a plurality of semiconductor chips formed on a semiconductor wafer, and to a manufacturing method thereof.

2. Related Art

An apparatus is already known to conduct a test to a semiconductor wafer in which a plurality of semiconductor chips are formed to test acceptability of each semiconductor chip (see Patent Document No. 1 for example). Such an apparatus can have a probe card that can be collectively electrically connected to a plurality of semiconductor chips.

Patent Document No. 1: Japanese Patent Application Publication No. 2002-222839

One method of testing a semiconductor chip uses a BOST circuit. The BOST circuit can be mounted on a probe card. When a test is conducted to a semiconductor wafer, however, a multitude of BOST circuits are required, which are difficult to be implemented on the printed circuit board of the probe card.

So as to solve the mentioned problem, usage of a semiconductor wafer for a probe card is possible. By doing so, the BOST circuits can be formed highly densely by a semiconductor process, which allows a multitude of BOST circuits to be formed on a probe card.

Usage of a semiconductor wafer for a probe card has the following problem. The semiconductor wafer has to be provided with via holes for electrically connecting the front surface and the rear surface of the semiconductor wafer. Here, because the probe card has been provided with BOST circuits, the time required for forming the via holes should be as short as possible so as to reduce the damage onto the BOST circuits. For example, the time required for forming the via holes penetrating through the semiconductor wafer can be reduced by making the semiconductor wafer used as a board of the probe card as thin as possible.

However, when the semiconductor wafer becomes thin, the strength thereof decreases. Generally speaking, a probe card is brought into contact with a chip to be tested at a certain pressure, the decrease in strength of the semiconductor wafer used as the probe card is not desirable. Especially when the plurality of semiconductor chips formed on a wafer to be tested are tested collectively, the probe card has to have a large area, and so the problem incurred by the decrease in strength of a semiconductor wafer becomes more noticeable.

SUMMARY

Therefore, it is an object of an aspect of the innovations herein to provide a test apparatus, a test method, and a system, which are capable of overcoming the above drawbacks accompanying the related art. The above and other objects can be achieved by combinations described in the claims. A first aspect of the innovations may include a manufacturing method of manufacturing a wafer unit for testing provided with a plurality of test circuits that are for testing a plurality of semiconductor chips formed on a semiconductor wafer, the method including: forming the plurality of test circuits on a circuit wafer; forming, on a predetermined surface of a connection wafer, a plurality of circuit pads to be electrically connected to the plurality of test circuits, forming, on a rear surface of the connection wafer opposing the predetermined surface, a plurality of wafer pads to be electrically connected to the plurality of semiconductor chips, and forming a plurality of long via holes to electrically connect the plurality of circuit pads and the plurality of wafer pads; and forming the wafer unit for testing, by overlapping the circuit wafer and the connection wafer to electrically connect the plurality of test circuits and the plurality of circuit pads.

A second aspect of the innovations may include a wafer unit for testing provided with a plurality of test circuits that are for testing a plurality of semiconductor chips formed on a semiconductor wafer, the wafer unit for testing including: a circuit wafer provided with the plurality of test circuits; and a connection wafer having: a predetermined surface provided with a plurality of circuit pads to be electrically connected to the plurality of test circuits; and a rear surface opposing the predetermined surface provided with a plurality of wafer pads to be electrically connected to the plurality of semiconductor chips, the connection wafer being provided with a plurality of long via holes to electrically connect the plurality of circuit pads and the plurality of wafer pads.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
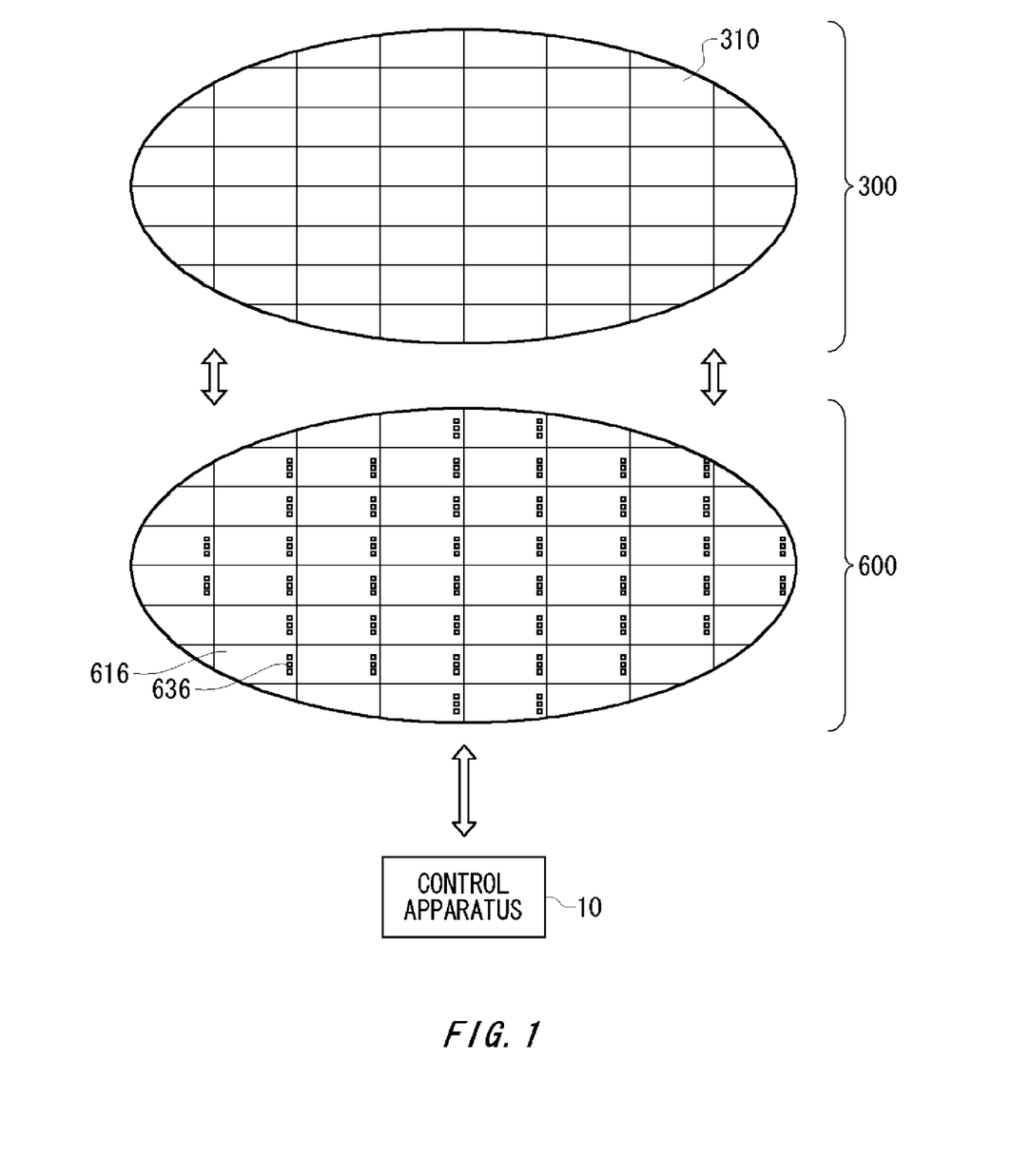
FIG. 1 shows an overview of a test utilizing a wafer unit 600 for testing.

FIG. 1 shows an overview of a test utilizing a wafer unit 600 for testing. In the present example, each of the semiconductor chips 310 of the semiconductor wafer 300 is tested using the wafer unit 600 for testing.

The wafer unit 600 for testing may have a wafer made by the same material used to make the semiconductor wafer 300 to be tested. The wafer unit 600 for testing may also have a diameter that is substantially the same as the diameter of the substrate of the semiconductor wafer 300 to be tested. The wafer of the wafer unit 600 for testing is provided to overlap the semiconductor wafer 300, thereby allowing collective electrical connection with the examination pads of the plurality of semiconductor chips 310. The surface of the wafer unit 600 for testing that faces the semiconductor wafer 300 may be provided with a plurality of wafer pads 636 that respectively correspond to the pads of the semiconductor chips 310.

The wafer unit 600 for testing further includes a plurality of test circuits 616 corresponding to the plurality of semiconductor chips 310. The wafer unit 600 for testing may include the plurality of test circuits 616 in one to one correspondence with the plurality of semiconductor chips 310. Each test circuit 616 may test a corresponding one of the semiconductor chips 310 based on the test data provided in advance. Each test circuit 616 may generate a test signal to be supplied to the corresponding semiconductor chip 310, and may determine the acceptability of the semiconductor chip 310 based on a response signal outputted from the corresponding semiconductor chip 310.

The control apparatus 10 may supply, to each test circuit 616, test data, a power supply, a control signal, and so on. The control apparatus 10 may write the same test data in parallel to the test circuits 616. The wafer unit 600 for testing tests the plurality of semiconductor chips 310 in parallel, by being collectively electrically connected to the plurality of semiconductor chips 310 on the semiconductor wafer 300 to be tested. FIG. 1 shows as if the test circuits 616 and the wafer pads 636 are provided on the same wafer of the wafer unit 600 for testing. However, the test circuits 616 and the wafer pads 636 are provided on different wafers from each other in the wafer unit 600 for testing.

Figure 2A:
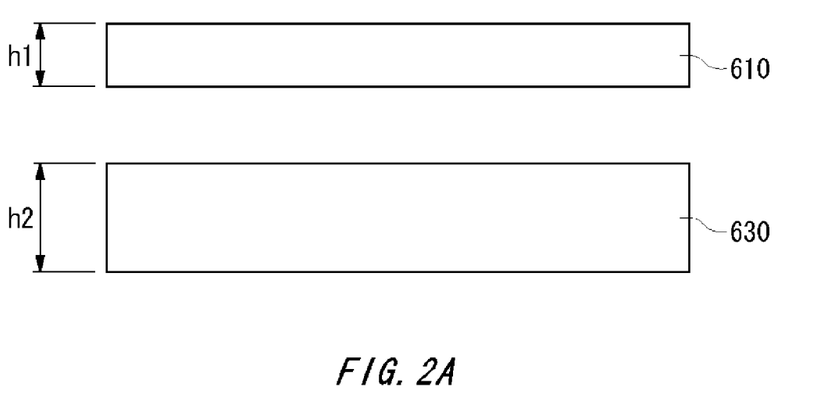
FIG. 2A shows a circuit wafer 610 and a connection wafer 630 to be prepared.
Figure 2B:
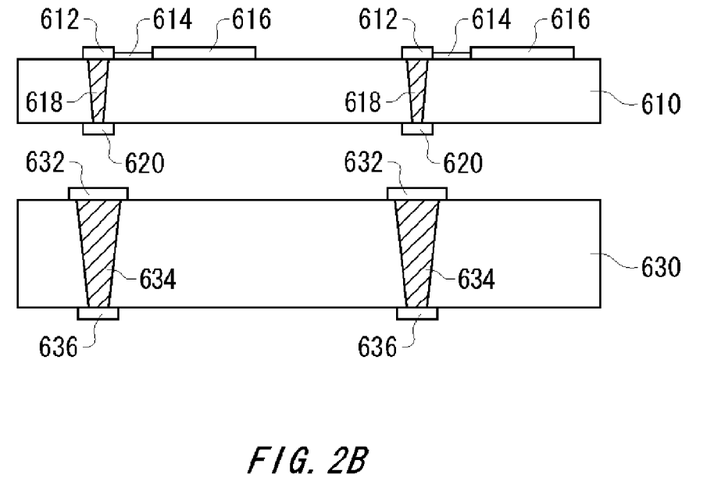
FIG. 2B shows pads or the like formed on the circuit wafer 610 and the connection wafer 630.
Figure 2C:
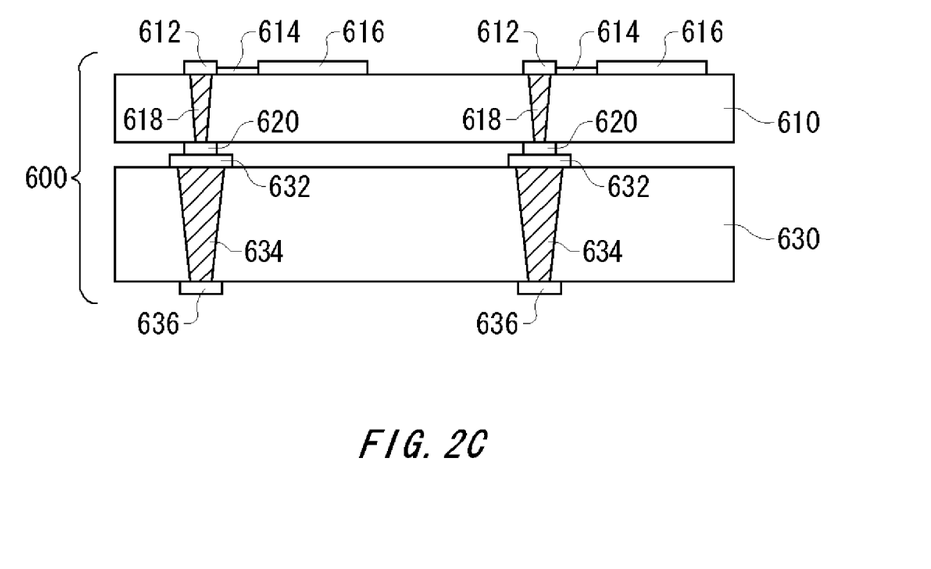
FIG. 2C shows an example of the wafer unit 600 for testing.

FIG. 2A through FIG. 2C show an exemplary manufacturing method of a wafer unit 600 for testing. FIG. 2A shows a circuit wafer 610 and a connection wafer 630 to be prepared. FIG. 2B shows pads or the like formed on the circuit wafer 610 and the connection wafer 630. FIG. 2C shows an example of the wafer unit 600 for testing.

First, as shown in FIG. 2A, the circuit wafer 610 and the connection wafer 630 are prepared. Here, a wafer having a wafer thickness h2 that is larger than the wafer thickness h1 of the circuit wafer 610 is prepared as the connection wafer 630.

The circuit wafer 610 and the connection wafer 630 may be formed by the same board material. The circuit wafer 610 and the connection wafer 630 may be formed as the same board material as that of the semiconductor wafer 300 to be tested. The circuit wafer 610 and the connection wafer 630 may be a silicon wafer.

In addition, the circuit wafer 610 and the connection wafer 630 may respectively be wafers having substantially the same diameter. The circuit wafer 610 and the connection wafer 630 may also have the same diameter as the diameter of the semiconductor wafer 300 to be tested.

Next, as shown in FIG. 2B, such elements as a pad, a wire, and a circuit are formed on the circuit wafer 610 and the connection wafer 630. These elements may be formed by a semiconductor process such as exposure. The device formation to the circuit wafer 610 and the connection wafer 630 is performed separately from each other.

A plurality of test circuits 616 are formed on the wafer surface of the circuit wafer 610. As mentioned above, the test circuits 616 are formed in correspondence with the plurality of semiconductor chips 310 to be tested, so that each test circuit 616 can test the corresponding semiconductor chip 310. Each test circuit 616 may include a circuit for generating a test signal to be supplied to the corresponding semiconductor chip 310. Each test circuit 616 may also include a circuit for determining acceptability of the corresponding semiconductor chip 310 based on the signal outputted from the semiconductor chip 310.

A plurality of front-surface pads 612, a plurality of rear-surface pads 620, a plurality of wires 614, and a plurality of short via holes 618 are further formed on the circuit wafer 610, in correspondence with the plurality of test circuits 616. The front-surface pads 612 are formed on the same surface of the circuit wafer 610 on which the test circuits 616 are formed. Each of the wires 614 electrically connects the corresponding test circuit 616 and the corresponding front-surface pad 612.

Each rear-surface pad 620 is formed on the rear surface of the circuit wafer 610 at the back of the surface on which the test circuits 616 are formed. Each short via hole 618 is formed through the circuit wafer 610 so as to electrically connect the corresponding test circuit 616 and the corresponding rear-surface pad 620 via the front-surface pad 612. For example, a short via holes 618 may be formed by forming a through hole through the circuit wafer 610 by etching or the like, and applying a conductive material to the surface of the through hole by evaporation or the like. A front-surface pad 612 and a rear-surface pad 620 are formed at both ends of a short via hole 618.

Here, application of a conductive material to a short via hole 618 involves processing such as heating or charge, which may cause damage to the already-formed test circuits 616. The damage to the test circuits 616 depends on the time length of the process of applying the conductive material to the short via holes 618. The time length of the process of applying the conductive material to the short via holes 618 depends on the length, the surface area, or the like of the short via holes 618. Therefore, the wafer thickness h1 of the circuit wafer 610 is desirably sufficiently thin so that the damage to the test circuits 616 can be negligible when applying the conductive material to the short via holes 618. The wafer thickness h1 of the circuit wafer 610 may be about several tens of μm.

The connection wafer 630 is provided with a plurality of circuit pads 632, a plurality of wafer pads 636, and a plurality of long via holes 634. The plurality of circuit pads 632 are formed on a predetermined surface of the connection wafer 630 that faces the circuit wafer 610, to be electrically connected to the plurality of test circuits 616. For example, the plurality of circuit pads 632 are formed in one to one correspondence with the plurality of rear-surface pads 620.

The wafer pads 636 are provided on the rear surface opposing the above-mentioned predetermined surface to be electrically connected to the plurality of semiconductor chips 310. The plurality of wafer pads 636 are formed in one to one correspondence with the plurality of circuit pads 632.

Each long via holes 634 are formed through the connection wafer 630 to electrically connect the corresponding circuit pad 632 and the corresponding wafer pad 636. For example, a long via hole 634 may be formed by forming a through hole through the connection wafer 630 by etching or the like, and applying a conductive material to the surface of the through hole by electrolytic plating or the like. A circuit pad 632 and a wafer pad 636 are formed at both ends of a long via hole 634.

The long via holes 634 may be formed by the same method used to form the short via holes 618, or may be formed by a method suitable for forming a via hole of a larger area. Since a circuit for generating a signal or the like is not formed on the connection wafer 630, the long via holes 634 may be formed in a longer time than the short via holes 618. The time required for depositing a conductive material on the short via holes 618 maybe shorter than the time required for depositing a conductive material on the long via holes 634.

Next, as shown in FIG. 2C, a wafer unit 600 for testing is formed by overlapping the circuit wafer 610 and the connection wafer 630 so that each rear-surface pad 620 and its corresponding circuit pad 632 are electrically connected to each other. By doing so, the plurality of test circuits 616 are electrically connected to the plurality of wafer pads 636 via the plurality of circuit pads 632. Each wafer pad 636 is electrically connected to a corresponding semiconductor chip 310 of the semiconductor wafer 300 to be tested, to allow collective testing of the semiconductor chips 310.

As described above, in the wafer unit 600 for testing in the present example, a comparatively thin circuit wafer 610 is used to mount a test circuit 616, and so the damage to the test circuit 616 in forming a short via hole 618 to the circuit wafer 610 can be alleviated. Moreover, a comparative thick connection wafer 630 is overlapped on the circuit wafer 610, the strength of the wafer unit 600 for testing can increase. Therefore, even when a semiconductor wafer 300 having a large area is tested, the wafer unit 600 for testing will not break.

Note that the circuit wafer 610 and the connection wafer 630 may be fixed in the overlapped state. They may be attached to each other using an anisotropic conductive sheet having adhesiveness or the like. A different attaching method may also be used.

Figure 3:
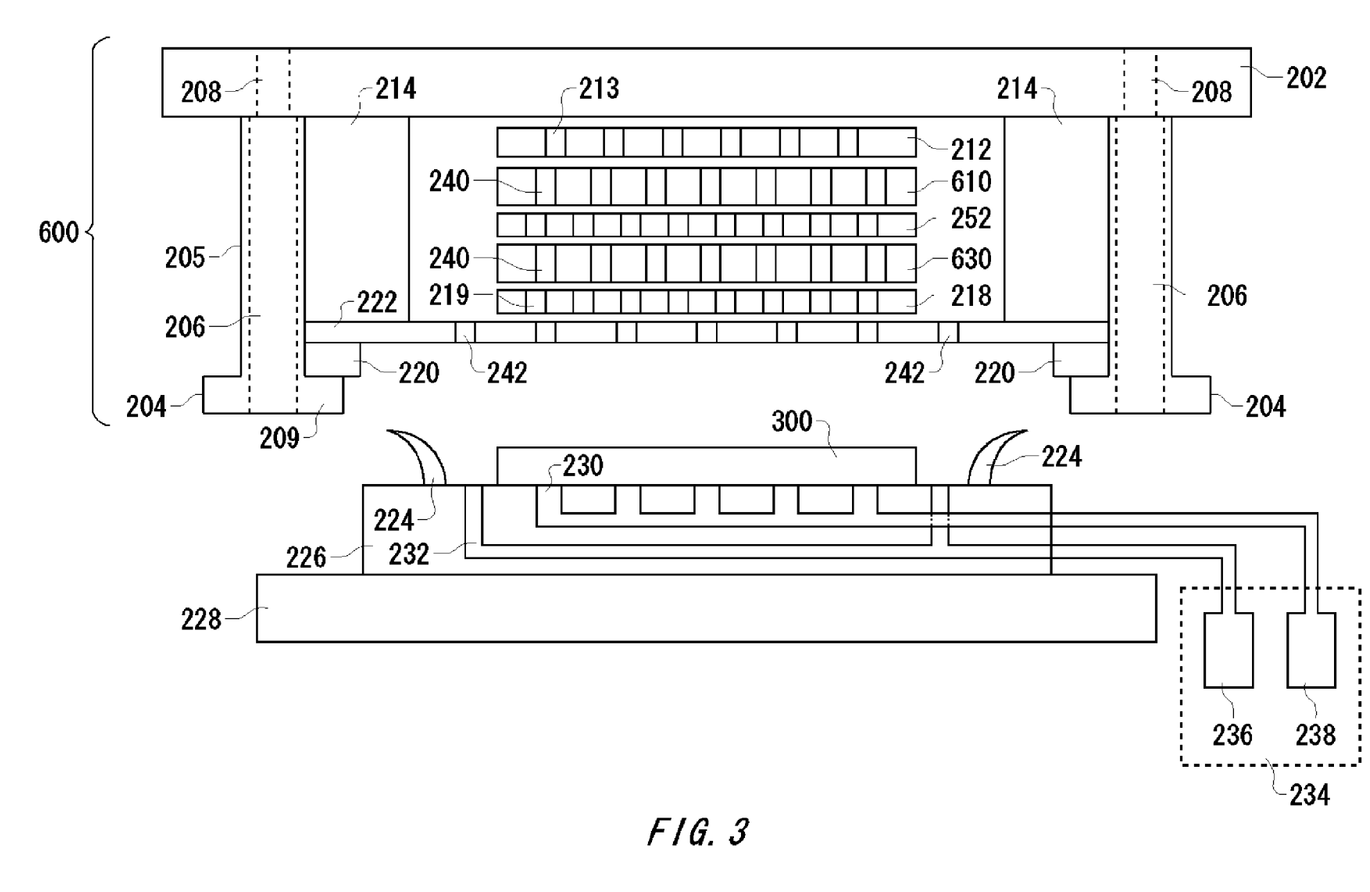
FIG. 3 shows a detailed configuration example of the wafer unit 600 for testing.

FIG. 3 shows a detailed configuration example of the wafer unit 600 for testing. The wafer unit 600 for testing in the present example stores, between the wire substrate 202 and the membrane 222, the circuit wafer 610 and the connection wafer 630. The wire substrate 202 may be a printed circuit board on which a wire is provided to electrically connect the test circuits 616 of the circuit wafer 610 to the control apparatus 10.

The circuit wafer 610 is electrically connected to the wire substrate 202 via an apparatus anisotropic conductive sheet 212. The connection wafer 630 is electrically connected to the circuit wafer 610 via an intermediate anisotropic conductive sheet 252. The connection wafer 630 is electrically connected to the membrane 222 via a wafer anisotropic conductive sheet 218.

The support 204 supports the membrane 222 with respect to the wire substrate 202, to fix, to the wire substrate 202, the apparatus anisotropic conductive sheet 212, the circuit wafer 610, the intermediate anisotropic conductive sheet 252, the connection wafer 630, and the wafer anisotropic conductive sheet 218.

The support 204 may include an elongating section 205 that elongates in the vertical direction from the rear surface of the wire substrate 202, and the engaging section 209 that engages a fixing ring 220 at the lower end of the elongating section 205. In other words, the support 204 supports the fixing ring 220, to support the membrane 222 fixed to the fixing ring 220.

The support 204 may support the lower end of the fixing ring 220 at a position distant from the lower surface of the wire substrate 202 by a predetermined distance, and not to be distant from the lower surface of the wire substrate 202 by more than the predetermined distance. A screw may be inserted to the screw hole 208 provided for the wire substrate 202 and to the screw hole 206 provided for the support 204, thereby fixing the support 204 to the wire substrate 202. The diameter of the screw hole 206 may be larger than the diameter of the screw hole 208.

The apparatus sealing section 214 is provided along the periphery of the surface of the membrane 222 nearer the wire substrate 202, to seal between the periphery of the surface of the membrane 222 nearer the wire substrate 202 and the wire substrate 202. The apparatus sealing section 214 may be formed by an elastic material having elasticity. The membrane 222 is provided between the wafer anisotropic conductive sheet 218 and the semiconductor wafer 300. The membrane 222 may have a bump terminal for electrically connecting the terminal of the semiconductor wafer 300 to the wafer pad 636 of the connection wafer 630.

The fixing ring 220 fixes the membrane 222 to the apparatus sealing section 214. As shown in FIG. 3, a gap may be formed between each anisotropic conductive sheet and each wafer, and the apparatus sealing section 214.

The fixing ring 220 may be provided in an annular formation along the periphery of the surface of the membrane 222 nearer the semiconductor wafer 300. The membrane 222 has a round shape of a diameter substantially the same as that of the fixing ring 220, and an end of the membrane 222 is fixed to the fixing ring 220. According to this configuration, the wafer unit 600 for testing in which the circuit wafer 610 and the connection wafer 630 are overlapped can be formed.

The membrane 222 of the wafer unit 600 for testing is electrically connected to the semiconductor wafer 300 mounted on the wafer tray 226. The wafer tray 226 is moved to a predetermined position by a wafer stage 228.

The wafer tray 226 is provided to form a hermetically sealed space with the wire substrate 202. The wafer tray 226 in the present example forms a hermetically sealed space with the wire substrate 202, the apparatus sealing section 214, and the wafer sealing section 224. A semiconductor wafer 300 is also mounted to the surface of the wafer tray 226 nearer the hermetically sealed space.

The wafer sealing section 224 is provided on the surface of the wafer tray 226 along a region corresponding to the periphery of the membrane 222, and seals between the periphery of the surface of the membrane 222 nearer the wafer tray and the wafer tray 226. The wafer sealing section 224 may be formed in an annular formation on the surface of the wafer tray 226.

The wafer sealing section 224 may be formed in a "lip"-like formation such that the diameter of the annular formation enlarges as the distance from the surface of the wafer tray 226 increases. When the wafer sealing section 224 is pressed against the membrane 222, the pressuring force curves the tip thereof, thereby causing the membrane 222 to approach the semiconductor wafer 300. The wafer sealing section 224 is formed so that the height thereof, in a state where it is not pressed against the membrane 222, from the surface of the wafer tray 226 is larger than the height of the semiconductor wafer 300.

The decompression section 234 decompresses a hermetically sealed space between the wire substrate 202 and the wafer tray 226, which is formed by the wire substrate 202, the wafer tray 226, the apparatus sealing section 214, and the wafer sealing section 224. As a result, the decompression section 234 causes the wafer tray 226 to move to a predetermined position from the wire substrate 202. The wafer tray 226, by being placed in the predetermined position, applies the pressure onto each anisotropic conductive sheet, to electrically connect the wire substrate 202, the circuit wafer 610, the connection wafer 630, the membrane 222, and the semiconductor wafer 300.

In addition, the wafer sealing section 224 may contact the membrane 222, at the inside of the fixing ring 220. In this case, the membrane 222 separates the hermetically sealed space between the wire substrate 202 side and the wafer tray 226 side. Therefore, it is desirable to provide the membrane 222 with penetrating holes 242 connecting these spaces. In addition, the apparatus anisotropic conductive sheet 212, the circuit wafer 610, the connection wafer 630, and the wafer anisotropic conductive sheet 218 may also be desirably provided with penetrating holes 213, penetrating holes 240, and penetrating holes 219 respectively.

In addition, the apparatus anisotropic conductive sheet 212, the circuit wafer 610, the intermediate anisotropic conductive sheet 252, the connection wafer 630, and the wafer anisotropic conductive sheet 218 may also be provided with penetrating holes respectively. These penetrating holes may be dispersed substantially uniformly within respective surfaces. According to such a configuration, the air absorbed during decompression of the hermetically sealed space is dispersed to flow via the multitude of penetrating holes.

Therefore, during decompression of the hermetically sealed space, the pressure applied on the anisotropic conductive sheets is dispersed substantially uniformly within respective surfaces, thereby substantially reducing the stress distortion during the decompression. This helps prevent the cracking of the wafer or the distortion of the anisotropic conductive sheets, or the like. In addition, the penetrating holes 242 provided for the membrane 222 enable a single decompression section 234 to decompress the space nearer the wire substrate 202 as well as the space nearer the semiconductor wafer 300, and to electrically connect them.

The decompression section 234 may also cause the semiconductor wafer 300 to attach by suction to the wafer tray 226. The decompression section 234 in this example includes a decompressor 236 for hermetically sealed space, and a decompressor 238 for semiconductor wafer. In addition, the wafer tray 226 is provided with an air inlet path 232 for hermetically sealed space and an air inlet path 230 for semiconductor wafer.

According to the stated configuration, the connection wafer 630 fixed to the wire substrate 202 can be electrically connected to the semiconductor wafer 300. In the state in which the connection wafer 630 and the semiconductor wafer 300 are electrically connected to each other, the air inlet path 232 for hermetically sealed space and the air inlet path 230 for semiconductor wafer are sealed, to fix the connection wafer 630 and the semiconductor wafer 300.

Figure 4:
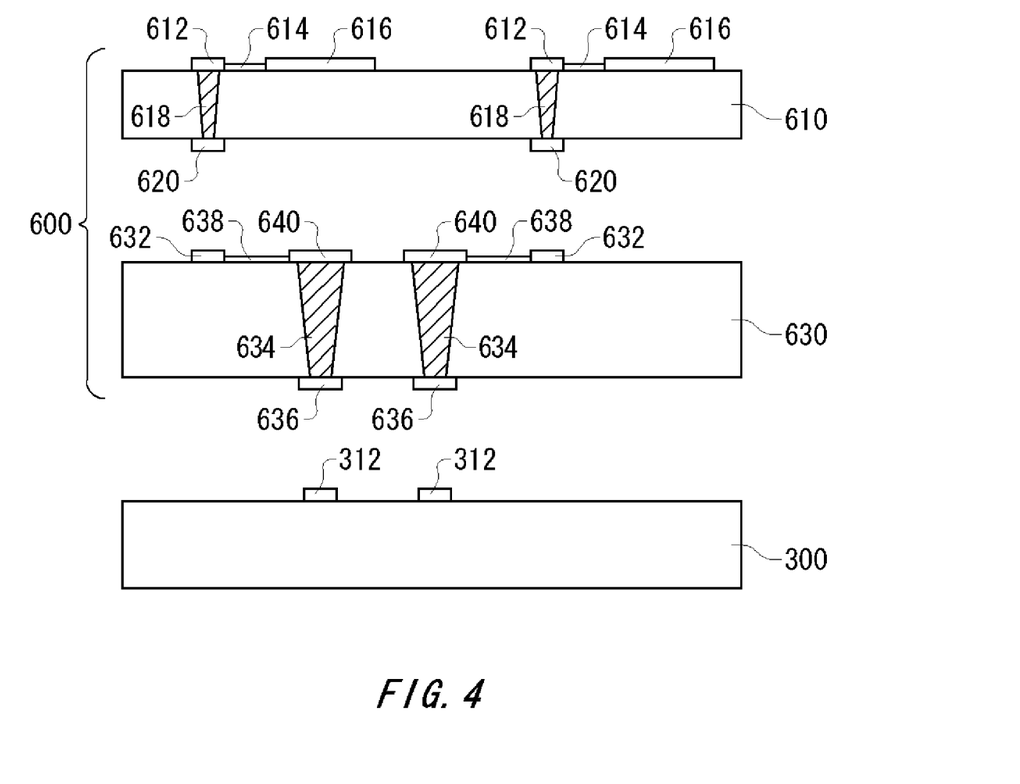
FIG. 4 shows another example of the wafer unit 600 for testing.

FIG. 4 shows another example of the wafer unit 600 for testing. In the connection wafer 630 of the present example, the plurality of wafer pads 636 are formed at a different pad interval from that of the plurality of circuit pads 632. That is, the connection wafer 630 of the present example also functions as a pitch conversion substrate. For example, the plurality of circuit pads 632 are formed at positions corresponding to the rear-surface pads 620 of the circuit wafer 610. The plurality of wafer pads 636 are formed at positions corresponding to the pads 312 of the semiconductor wafer 300. According to this configuration, the circuit wafer 610 and the semiconductor wafer 300 having different pad intervals from each other can be electrically connected to each other.

Note that an end of a long via holes 634 of the present example is connected to a wafer pad 636. The connection wafer 630 is also provided with a plurality of pitch conversion wires 638 and a plurality of intermediate pads 640. The plurality of intermediate pads 640 are formed at positions enabling connection to the other ends of the long via holes 634. Each pitch conversion wire 638 electrically connects the other end of the corresponding long via hole 634 to the corresponding circuit pad 632 via the intermediate pad 640.

Figure 5:
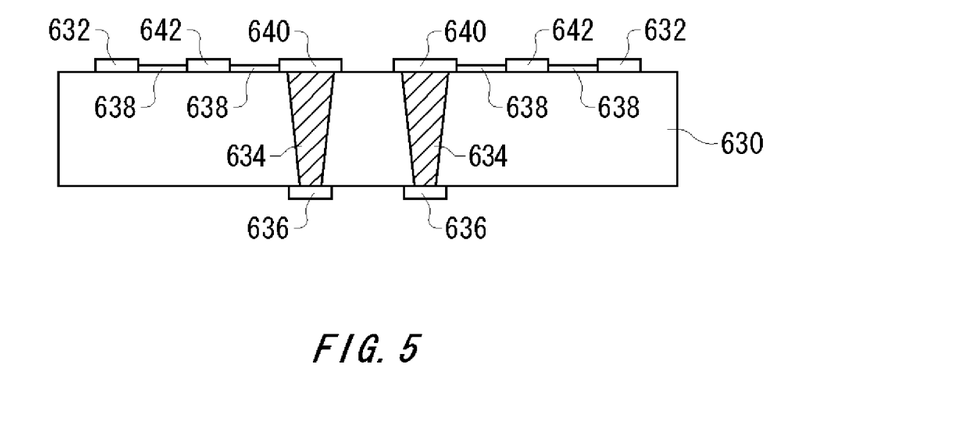
FIG. 5 shows another example of the connection wafer 630.

FIG. 5 shows another example of the connection wafer 630. A plurality of switches 642 are formed on the connection wafer 630 in the present example, in addition to the configuration of the connection wafer 630 explained with reference to FIG. 1 through FIG. 4. The plurality of switches 642 may be provided in one to one correspondence with the plurality of wafer pads 636.

Each switch 642 switches electrical connection between the corresponding wafer pad 636 and the corresponding test circuit 616. Each switch 642 may have a transistor provided between a circuit pad 632 and an intermediate pad 640.

Figure 6:
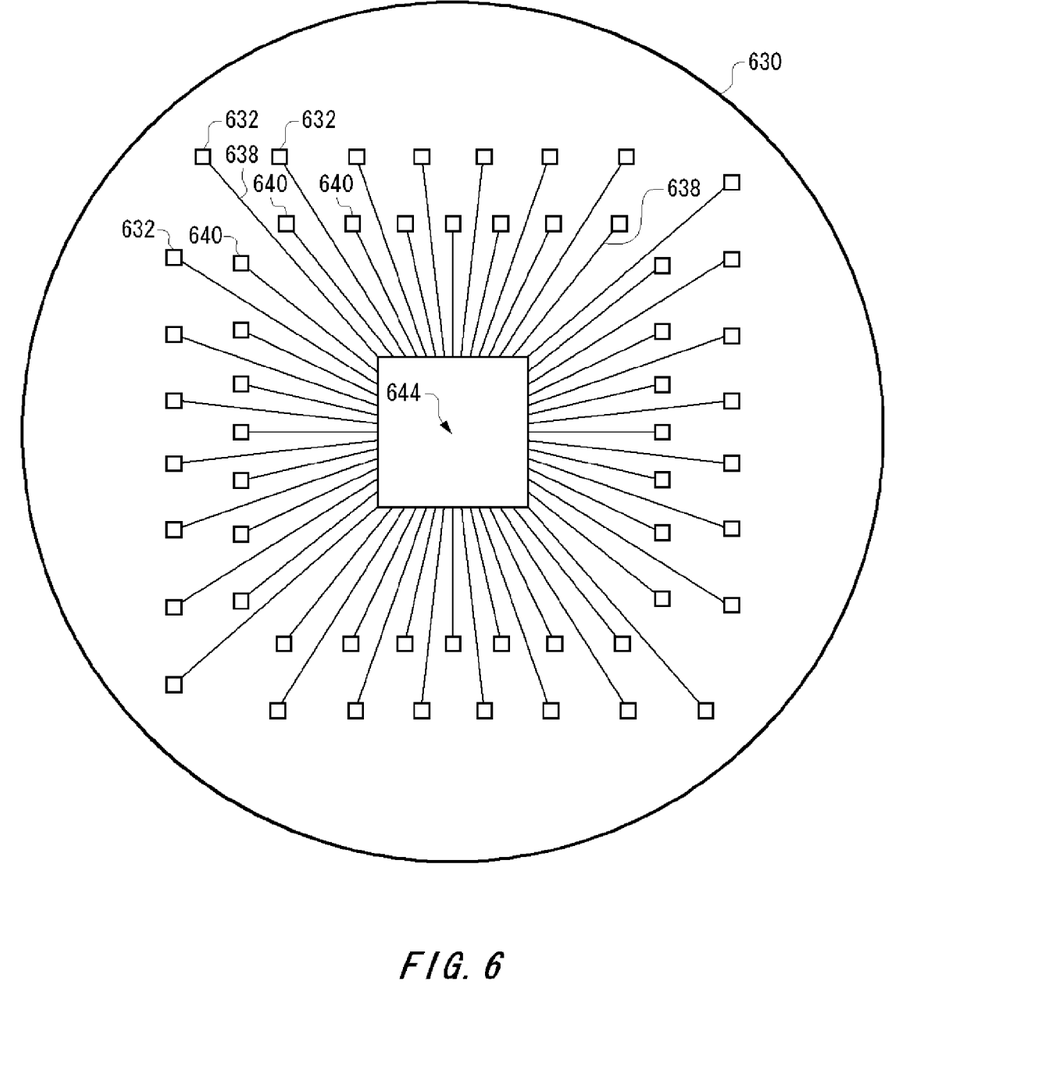
FIG. 6 shows another example of the connection wafer 630.

FIG. 6 shows another example of the connection wafer 630. The connection wafer 630 in the present example is further provided with a switch section 644 in addition to the configuration of the connection wafer 630 explained with reference to FIG. 1 through FIG. 4. The switch section 644 switches which of the test circuits 616 each wafer pad 636 is to be electrically connected to. The switch section 644 of the present example switches which of the intermediate pads 640 each circuit pad 632 is to be connected to, thereby switching the connection relation between the wafer pads 636 and the test circuits 616.

Figure 7:
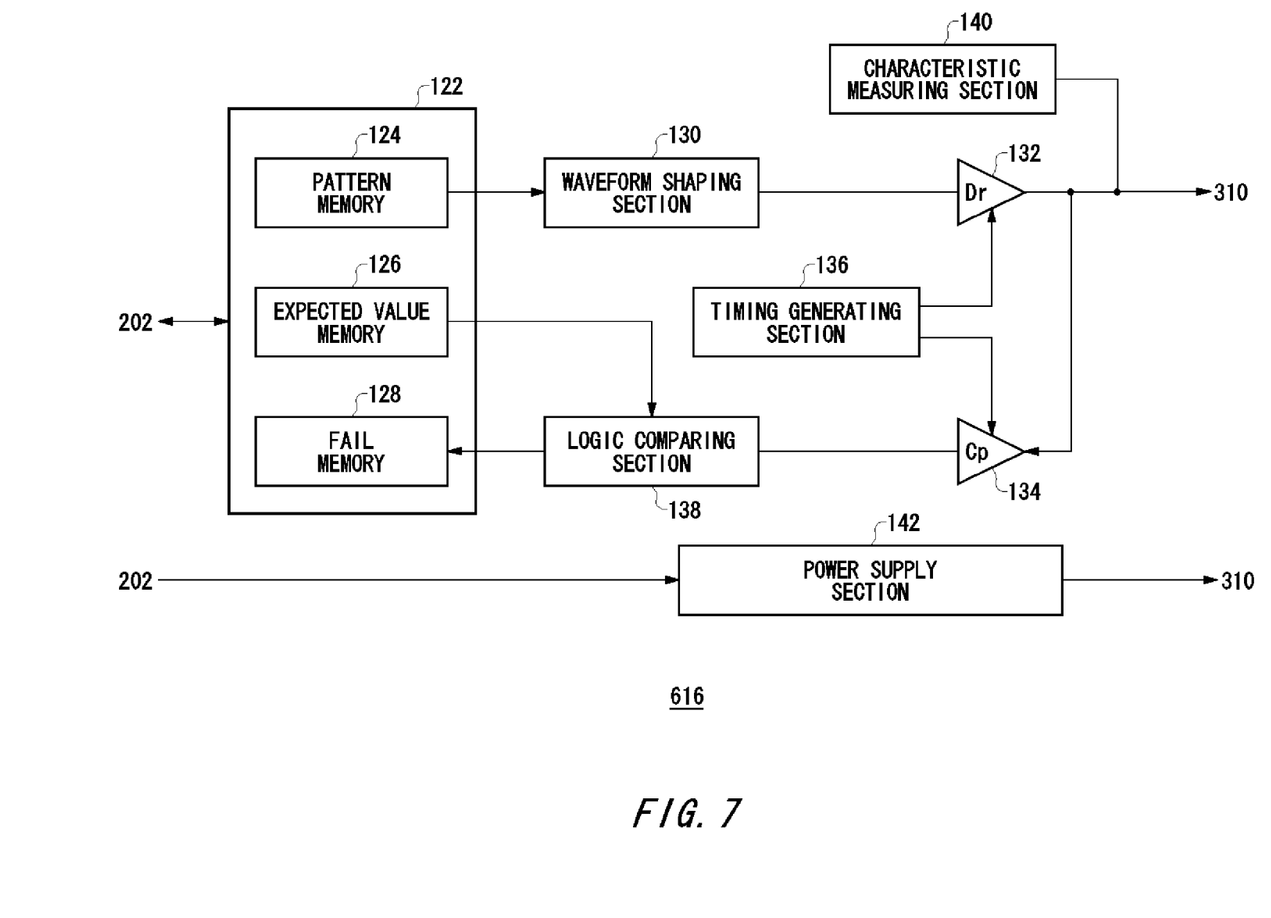
FIG. 7 is a block diagram showing an exemplary functional configuration of a test circuit 616.

FIG. 7 is a block diagram showing an exemplary functional configuration of a test circuit 616. The test circuit 616 includes a pattern generating section 122, a waveform shaping section 130, a driver 132, a comparator 134, a timing generating section 136, a logic comparing section 138, a characteristic measuring section 140, and a power supply section 142. Note that the test circuit 616 may have the configuration of FIG. 7 for each input/output pin of the semiconductor chip 310 connected thereto. The explained configurations may be formed on the circuit wafer 610 by a semiconductor process such as exposure.

The pattern generating section 122 generates a logic pattern of a test signal. The pattern generating section 122 of the present example includes a pattern memory 124, an expected value memory 126, and a fail memory 128. The pattern generating section 122 may output a logic pattern pre-stored in the pattern memory 124. The pattern memory 124 may store a logic pattern supplied from the control apparatus 10 prior to starting of a test. The pattern generating section 122 may also generate the logic pattern based on an algorithm supplied in advance.

The waveform shaping section 130 shapes the waveform of a test signal based on the logic pattern supplied from the pattern generating section 122. The waveform shaping section 130 may shape the waveform of a test signal by outputting the voltage corresponding to each logical value of a logic pattern in each predetermined bit period.

The driver 132 outputs a test signal corresponding to the waveform supplied from the waveform shaping section 130. The driver 132 may output a test signal according to the timing signal supplied from the timing generating section 136. The driver 132 may output a test signal having the same period as that of the timing signal. The driver 132 supplies the test signal to the corresponding semiconductor chip 310.

The comparator 134 measures a response signal outputted from the semiconductor chip 310. The comparator 134 may measure the logic pattern of the response signal, by sequentially detecting the logical value of the response signal according to the strobe signal supplied from the timing generating section 136.

The logic comparing section 138 functions as a determining section that determines the acceptability of a corresponding semiconductor chip 310 based on the logic pattern of the response signal measured by the comparator 134. The logic comparing section 138 may determine the acceptability of the semiconductor chip 310 based on the determination as to whether the expected value pattern supplied from the pattern generating section 122 matches the logic pattern detected by the comparator 134. The pattern generating section 122 may supply, to the logic comparing section 138, the expected value pattern stored in advance in the expected value memory 126. The expected value memory 126 may store the logic pattern supplied from the control apparatus 10 prior to starting of a test. The pattern generating section 122 may alternatively generate the expected value pattern based on an algorithm supplied in advance.

The fail memory 128 stores the comparison result of the logic comparing section 138. When a memory region of the semiconductor chip 310 is tested, the fail memory 128 may store the result of the acceptability determination of the logic comparing section 138 for each address of the semiconductor chip 310. The control apparatus 10 may read the acceptability determination result stored in the fail memory 128. The test circuit 616 may output the acceptability determination result stored in the fail memory 128, to the control apparatus 10 outside the wafer unit 600 for testing.

The characteristic measuring section 140 measures the waveform of the current or the voltage outputted from the driver 132. The characteristic measuring section 140 may function as a determining section that determines the acceptability of the semiconductor chip 310 based on the determination as to whether the waveform of the voltage or the current supplied from the driver 132 to the semiconductor chip 310 satisfies a predetermined specification.

The power supply section 142 supplies the source power for driving the semiconductor chip 310. The power supply section 142 may supply, to the semiconductor chip 310, the source power corresponding to the power supplied from the control apparatus 10 during a test. The power supply section 142 may also supply a driving power to each constituting element of the test circuit 616.

According to the stated configuration of the test circuit 616, a test system can reduce the size of the control apparatus 10. An exemplary control apparatus 10 is a general-purpose personal computer.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

What is claimed is:

1. A manufacturing method of manufacturing a wafer unit for testing provided with a plurality of test circuits that are for testing a plurality of semiconductor chips formed on a semiconductor wafer, the method comprising:

forming the plurality of test circuits on a circuit wafer coupled to pads of the circuit water;

forming, on a predetermined surface of a connection wafer, a plurality of circuit pads to be electrically connected to the plurality of test circuits by the pads of the circuit wafer;

forming, on a rear surface of the connection wafer opposing the predetermined surface, a plurality of wafer pads to be electrically connected to the plurality of semiconductor chips;

forming a plurality of long via holes extending through the connection wafer between the circuit pads and wafer pads; and forming the wafer unit for testing, by overlapping the circuit wafer and the connection wafer to electrically connect the plurality of test circuits and the plurality of circuit pads, wherein:

the connection wafer has a wafer thickness that is larger than a wafer thickness of the circuit wafer;

the plurality of wafer pads of the connection wafer are formed at a pad interval different from a pad interval of the plurality of circuit pads;

each of the long via holes is formed so that one end thereof is connected to a corresponding one of the plurality of wafer pads;

the manufacturing method further comprising:

forming, on the connection wafer, a pitch conversion wire to electrically connect the other end of each long via hole to a corresponding one of the plurality of circuit pads.

2. A wafer unit for testing provided with a plurality of test circuits that are for testing a plurality of semiconductor chips formed on a semiconductor wafer, the wafer unit for testing comprising:

a circuit wafer provided with the plurality of test circuits each coupled to a respective one of a plurality of pads of the circuit wafer; and a connection wafer having: a predetermined surface provided with a plurality of circuit pads each to be electrically connected to a respective one of the plurality of test circuits by the respective one of the plurality of pads of the circuit wafer, and a rear surface opposing the predetermined surface provided with a plurality of wafer pads to be electrically connected to the plurality of semiconductor chips, the connection wafer being provided with a plurality of long via holes to electrically connect the plurality of circuit pads and the plurality of wafer pads wherein, the connection wafer has a wafer thickness that is larger than a wafer thickness of the circuit wafer, the plurality of wafer pads of the connection wafer are formed at a pad interval different from a pad interval of the plurality of circuit pads;

each of the long via holes is formed so that one end thereof is connected to a corresponding one of the plurality of wafer pads; and a pitch conversion wire electrically connects the other end of each long via hole to a corresponding one of the plurality of circuit pads.

* * * * *